United States Patent [19]

Moritsugu et al.

[11] Patent Number: 5,699,343
[45] Date of Patent: Dec. 16, 1997

[54] DISK APPARATUS

[75] Inventors: Masaharu Moritsugu; Fuminori Setoyama, both of Kawasaki, Japan

[73] Assignee: Fujitsu Limited, Kawasaki, Japan

[21] Appl. No.: 601,294

[22] Filed: Feb. 16, 1996

[30] Foreign Application Priority Data

Mar. 30, 1995 [JP] Japan .................................. 7-072830

[51] Int. Cl.$^6$ ...................................................... G11B 7/00
[52] U.S. Cl. ...................................................... 369/124; 369/47
[58] Field of Search ............................ 369/124, 47, 48, 369/49, 50, 54, 58, 59, 32; 360/29, 32, 33.1, 46

[56] References Cited

U.S. PATENT DOCUMENTS

| 5,467,331 | 11/1995 | Saiki et al. | 369/124 |
| 5,491,682 | 2/1996 | Dohmeier et al. | 369/124 |

FOREIGN PATENT DOCUMENTS

| 55-122240 | 9/1980 | Japan . |
| 56-107314 | 8/1981 | Japan . |
| 58-202650 | 11/1983 | Japan . |
| 59-101010 | 6/1984 | Japan . |
| 01217776 | 8/1989 | Japan . |
| 02134707 | 5/1990 | Japan . |
| 05225569 | 9/1993 | Japan . |
| 06076303 | 3/1994 | Japan . |

*Primary Examiner*—Muhammad N. Edun
*Attorney, Agent, or Firm*—Greer, Burns & Crain, Ltd.

[57] ABSTRACT

An AC amplifying circuit is AC coupled through capacitors to a current/voltage converting circuit for converting a photosensitive current of a reproduction light from an optical disk medium to a voltage signal and for outputting as differential signals. A transient absorbing circuit compares reproduction voltages of the differential signals outputted from the AC amplifying circuit and controls charge and discharge of the capacitors on the basis of comparison outputs so that both of the reproduction voltages coincide with an AC ground, thereby automatically absorbing a transient state.

12 Claims, 13 Drawing Sheets

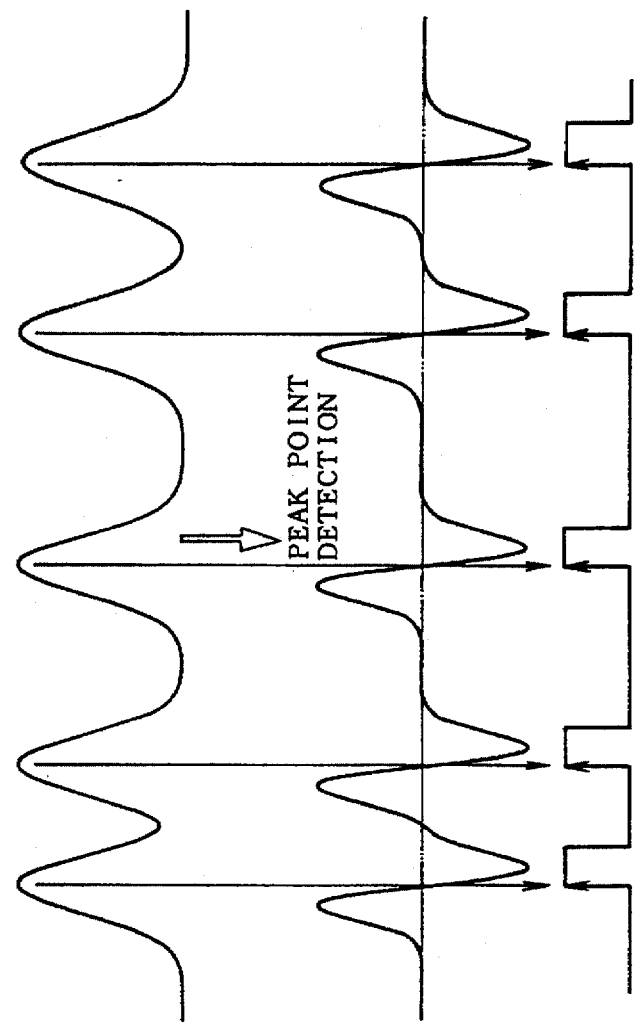

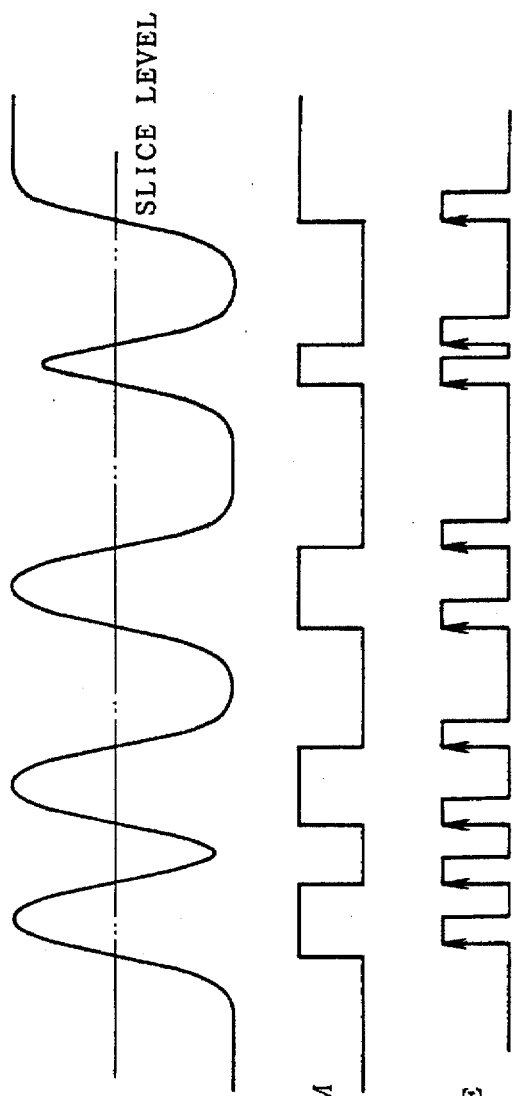
FIG. 2A  PRIOR ART  RECORDING CODE  0000100100100000100010000001010000100
FIG. 2B  RECORDING PIT
FIG. 2C  REPRODUCTION WAVEFORM — SLICE LEVEL
FIG. 2D  BINARY WAVEFORM
FIG. 2E  DETECTION PULSE

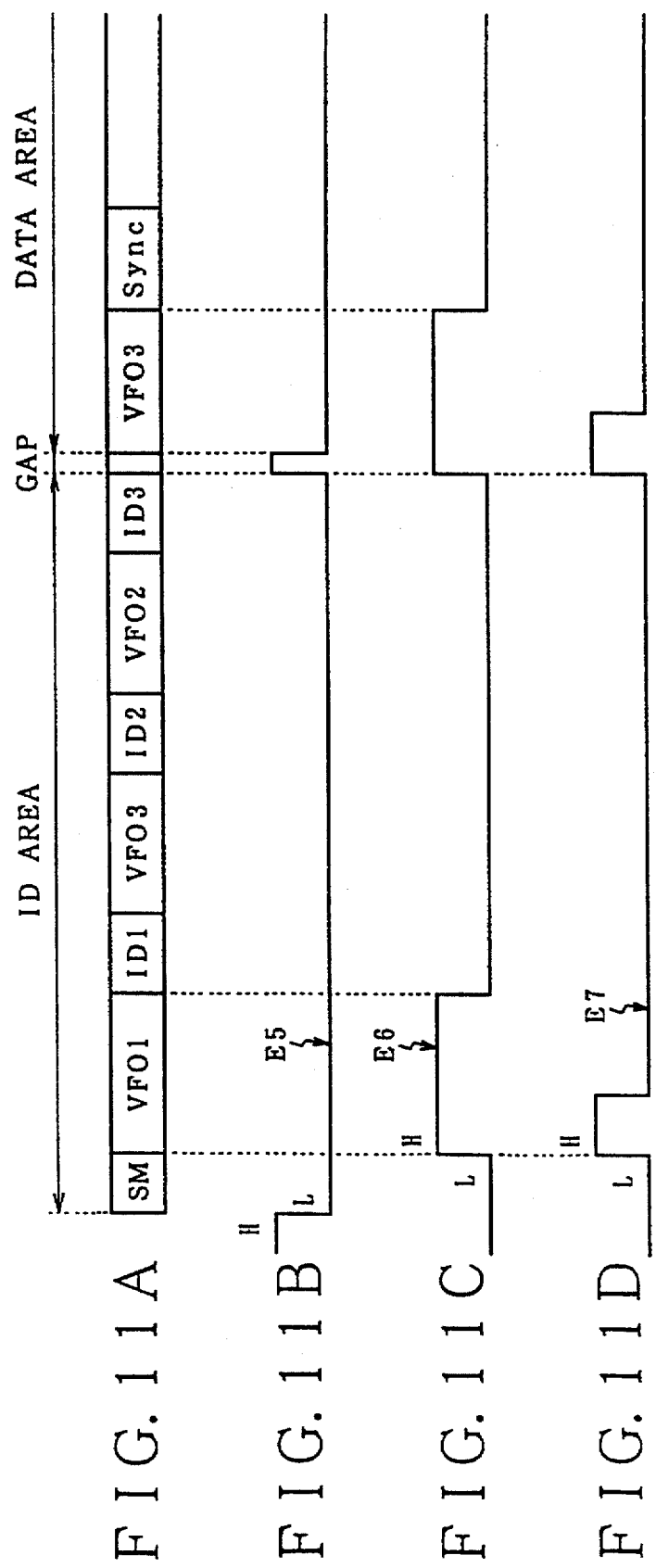

DISK APPARATUS

BACKGROUND OF THE INVENTION

The present invention relates to an optical disk apparatus and, more particularly, to an optical disk apparatus which dynamically absorbs a transient state which occurs in response to a leading edge of a reproduction signal inputted to a read demodulating circuit, thereby rapidly settling.

The optical disk is characterized in that it has a large capacity of more than 100 Mbytes and a portability such that a software operation environment and data can be carried as they are from a certain optical disk drive to another optical disk drive. The optical disk is being effectively used under the Windows environment or an environment in which a recent large scale software is used. Particularly, since optical disks of 90 mm (3.5 inches) appear at low costs, most of the problems such as high costs, low compatibility, low performance, and the like which have thus far occurred in optical disks of 130 mm (5.25 inches) are solved. For example, in a typical 90 mm optical disk apparatus, the price is around 100,000 yen, there is a compatibility because of the standardization to the ISO format and the formal support in the DOS, an accessing time is equal to 30 msec, and a transfer speed lies within a range from 300 kbytes/sec to 1 Mbytes/sec. Such an optical disk is comparable with a standard HDD (hard disk drive) of the previous generation. Under the present situation such that a standard capacity of the HDD built in a personal computer is steadily increasing from the 100 Mbyte-class to the 200 or 300 Mbyte-class, the capacity and performance of the optical disk have to be further improved in order to use the optical disk as a back-up of the HDD or an auxiliary memory medium.

FIGS. 1A to 1E show a conventional recording of an optical disk medium. Such a recording is called a PPM (Pit Position Modulation) recording. As shown in FIGS. 1A and 1B, the presence and absence of a pit on a memory medium directly correspond to data bits "1" and "0" of a recording code. A signal obtained by reproducing information recorded by the PPM recording system has a signal waveform having peak points (or bottom points) at the recording pits irrespective of the kind of memory medium as shown in FIG. 1C. A peak point detecting method of detecting the peak points of the reproduction signal is, therefore, used for reconstructing (demodulating) original data. According to such a method, the reproduction signal of FIG. 1C is differentiated as shown in FIG. 1D, zero-crossing points of a differential signal are recognized, and detection pulses of FIG. 1E are obtained as read data.

As mentioned above, by differentiating the reproduction signal, it is not necessary to reproduce a DC level. In the case where a reproducing system has no DC band, there is an advantage such that the signal detection can be stably executed. In the detection of, ideally, only the zero-crossing points in the differential signal, an erroneous data pulse is generated by an influence of noises even in a base portion where there is no peak point in the reproduction signal. An actual reproducing system, therefore, has a function to form a gate signal for deciding a detection timing in order to accurately detect the zero-crossing points in the differential signal. In addition, such a PPM recording system has advantages in that a margin is large for a sensitivity variation or a recording power variation of the memory medium. When considering recording density, however, the PPM recording is disadvantageous because, data is stored in a form of the presence or absence of the recording pit. Accordingly, only one recording pit can be allocated per period of the reproduction signal. On the other hand, if the data can be allocated to both edges (front/rear edges) of the recording pit, the recording density is simply doubled. In recent years, in, various technical examinations have been made so as to use a PWM (Pit Width Modulation) recording which has a large advantage in a viewpoint of the capacity. In the optical disk of 130 mm (5.25 inches), an examination for standardization is at the final stage and products are being put on the market although they are at a sample level.

FIGS. 2A to 2E show a PWM recording. As shown in FIGS. 2A and 2B, the largest different point of the PWM recording from the PPM recording is that the data bit "1" of a recording code is not allocated to the presence or absence of the recording pit, but the data bit "1" of the recording code is allocated to the edges of the recording pit. In case of the PWM recording, therefore, a pit width of the recording pit has a special meaning upon reproduction. A direct slice detecting method is used for the reproduction in the PWM recording. That is, a slice level is set to a reproduction waveform of FIG. 2C. A binary waveform of FIG. 2D is formed. As shown in FIG. 2E, detection pulses are formed synchronously with leading edges and trailing edges of the binary waveform, thereby obtaining read data. The reasons why the differentiation and the peak detection which are executed as in the reproduction of the PPM recording are not executed in the reproduction of the PWM recording are because a quadratic differentiation has to be performed for detecting the edge points of the PWM reproduction waveform by the differentiation and it is necessary to emphasize a high frequency range at a rate of 40 dB/decade and, by excessively emphasizing noise components in the high frequency range, it is remarkably disadvantageous in terms of an S/N ratio. When the slice level is directly determined in the reproduction waveform, however, there are various problems.

There are the following main problems regarding the slice level determination upon reproduction by the PWM recording method.

I. a base line fluctuation because of the AC coupling of the reproducing system

II. a transient state because of the AC coupling of the reproducing system as well III. an envelope fluctuation due to a board bi-refringence IV. signal amplitude and resolution fluctuations due to medium sensitivity and recording power fluctuations.

Among them, the problem of the transient state upon reproduction in the PWM recording will now be described in detail hereinbelow.

The reasons why the transient state occurs will be first described with reference to FIGS. 3A and 3B. Since the occurrence of the transient state doesn't depend on whether the recording to the optical disk medium is performed as a shape change such as concave and convex portions or the like or as a magnetoopical non-shape change, a case where the recording is performed as a reflectance change such that the reflectance is reduced at a recording pit will now be explained as a general case. As shown in FIG. 3A, on the optical disk medium, information is recorded as pits 208 in a land 204 sandwiched by guide grooves called pre-grooves 200 and 202 so that a reproducing light spot 206 can accurately follow a track. The pit recorded on the track of the optical disk medium is received as a reflection light by a photodiode 210 in FIG. 4 and is taken out as a photosensitive voltage from a DC amplifier 212, thereby obtaining a reproduction waveform as shown in FIG. 3B. First, a level of the reproduction waveform when the reproducing light spot 206 scans a non-signal interval where there is no pit is equal to $V_0$. When the reproducing light spot 206 reaches the pit, a reflection light amount decreases to $(V_0-V_2)$ due to a diffraction phenomenon of the light. In a state of a high recording density, $V_1$ is obtained as a signal amplitude. A resolution of the reproduction signal in this instance is defined by the following equation.

Resolution=V1/V2=30% to 50%

When the reproducing amplifier is the DC amplifier 212 as shown in FIG. 4, a signal as shown in FIG. 3B is obtained and a slice level can be also easily determined by a fixed slice. In the reproducing system, however, as shown in FIG. 5, a signal passes through amplifiers at many stages comprising an initial stage amplifier 220 of low noises for converting a current from the photodiode 210 to a voltage, an AGC amplifier 226, arranged at the post stage of the amplifier 220, for regulating a signal amplitude to a constant value, a low-pass filter for eliminating unnecessary high frequency components from an output of the AGC amplifier 226, a waveform equalizer 228 for further improving a resolution, and the like. The reproducing system, therefore, cannot help but use an AC amplifier construction in order to solve problems regarding a bias point, a DC drift, an offset, and further, high frequency characteristics, and the like at each stage. Particularly in case of pursuing low costs, it is actually almost impossible to form the whole apparatus by a DC amplifier construction. Thus, when the light spot suddenly scans a signal interval from the non-signal interval, the transient state becomes a serious problem when deciding the slice level occurs. The optical disks which are presently common are disks of the rewritable type called magnetooptical disks. In such a magnetooptical disk, track numbers and sector numbers have preliminarily been recorded as concave and convex shapes in an ID area (also called a header), a flat portion subsequent to the ID area is a data area which is magnetooptically rewritable.

FIG. 6 is a schematic diagram of a format of an optical disk of 90 mm (3.5 inches) which is at the final evaluation stage of the International Standardization Organization (ISO). First, one track is constructed by a set of sectors as minimum construction units. In this case, one track has 25 sectors. Each sector has 725 bytes. 55 bytes at the head of the sector are set to an ID area 216 including areas ID1, ID2, and ID3 in which the track numbers and sector numbers have preliminarily been recorded as concave and convex shapes. The same sector number and the same track number are respectively recorded in the ID1, ID2, and ID3 areas, thereby taking a countermeasure for an erroneous detection of an ID. Following the ID area 216, there is a data area (rewritable area) 218 consisting of 680 bytes in which data can be magnetooptically recorded and reproduced. SM denotes a sector mark designating the start of the sector. In the format of FIG. 6, VFO1 at the head of the ID area 216 and VFO3 at the head of the data area 218 are especially important areas. A single and highest density (highest frequency) pattern has been recorded in each of the VFO1 and VFO3 areas. The VFO1 and VFO3 areas are areas for securing a period of time necessary for an AGC to settle the signal amplitude to a constant value prior to the data start and is also necessary until a PLL/VFO for extracting a clock from read data is locked.

FIGS. 7A and 7B show reproduction waveforms of reproduction signals E11 and E12 just after capacitors 222 and 224 when an optical disk medium having the track format of FIG. 6 is reproduced by the AC coupled amplifying system of FIG. 5. A time constant τ of the transient state which occurs at this time is expressed by the product of the capacitor 222 or 224 constructing the AC coupling and a load resistor (input resistor) R, so that (τ=R.C). As is well known, transient response characteristics are shown by:

$V=\exp\{-(t/\tau)\}$

In FIG. 5, a photosensitive signal current of a reflection light from the optical disk is first converted to differential voltage signals by the I/V converter 220. The signals are transmitted through the capacitors 222 and 224 for cutting out DC components and are connected to the AGC amplifier 226 and the waveform equalizer 228 having an LPF and an equalizer. The LPF provided for the waveform equalizer 228 is used for eliminating high frequency noises and the equalizer operates so as to improve a resolution by increasing the signal amplitude reduced in an area (on the frequency axis) of high recording density. The reason why the signal is transmitted as differential signals from the I/V converter 220 is to eliminate common-mode noises such as clock noises and the like mixed on the way. An LPF of the Bessel type or the Equalripple type which has excellent phase delaying characteristics is often used as an LPF that is used in the reproducing system of the optical disk.

Reproduction waveforms of FIGS. 7A and 7B are waveforms just after the coupling capacitors 222 and 224. When it is now assumed that an input impedance of the AGC amplifier 226 is equal to (Z), the time constant τ in this instance is $\tau=1/(C\times Z/2)$. It is very difficult to form the slice level from such waveforms including the transient states. It can be also considered that the time constant τ is extremely reduced in order to rapidly settle the transient state. When the time constant τ is set to a very small value, the waveform *is influenced by a duty fluctuation amount of the data pattern*, so that an envelope fluctuation of the reproduction signal is caused. There is also, consequently, a limit to reduce the time constant.

SUMMARY OF THE INVENTION

According to the invention, there is provided an optical disk apparatus which rapidly settles a transient state without reducing a time constant, thereby enabling a slice level for a reproduction signal that was PWM recorded to be stably detected.

An optical disk apparatus of the invention uses an optical disk medium on which information is recorded as a refractive index change, a shape change, or a direction of magnetization. A data recording circuit records data onto the optical disk medium by a pit width modulation (PWM) such that an edge of a recording pit is formed in correspondence to a bit "1" of recording data. A data reproducing circuit reads out the data recorded on the disk medium by the pit width modulation and reproduces. According to the invention, as such a data reproducing circuit of the optical disk apparatus, there are provided: a current/voltage converting circuit for converting a photosensitive current of a reproduction light from the optical disk medium to a voltage signal and for outputting the reproduction current as differential signals; an AC amplifying circuit for AC coupling the differential signals from the current/voltage converting circuit through capacitors, amplifying an input reproduction voltage, and simultaneously outputting the amplified voltage as differential signals; and a transient absorbing circuit for comparing the reproduction voltages of the differential signals outputted from the AC amplifying circuit and for controlling charge and discharge of each of the capacitors on the basis of comparison outputs so that amplitude center levels of both of the reproduction voltages coincide with an AC ground of the differential signals.

The transient absorbing circuit includes a comparator for comparing the reproduction voltages of the differential signals outputted from the AC amplifying circuit and for outputting comparison signals of duties according to a crossing state in the AC ground; a source current source for supplying a current to each of the capacitors of the differential signals; a sync current source current source for absorbing the current from each of the capacitors of the differential signals; a first current switching unit for connecting the source current source to one of the capacitors in a signal level state of one of the comparison signals outputted from the comparator and for connecting the source current source to the other capacitor in a signal level state of the other comparison signal; and a second current switching unit for connecting the sync current source to one of the capacitors in a signal level state of one of inversion comparison signals outputted from the comparators and for connecting the sync current source to the other capacitor in a signal level state of the other inversion comparison signal.

Operation the transient absorbing circuit is controlled by a gate signal which is valid upon reproduction, generally, by an AGC gate signal. In the transient absorbing circuit, current values of the source current source and sync current source can be varied by a D/A converter. The source current source and sync current source are constructed so that their output currents are made proportional to an instruction current value by the D/A converter and can be selectively made operative by an external signal different from a signal for controlling the whole apparatus. The transient absorbing circuit operates in a VFO area which is located at the head portion of a sector format of the optical disk medium and in which data has been recorded at a single frequency. The D/A converter for setting the current values of the source current source and sync current source adjusts source and sync current source decreases the current values of the current sources in accordance with a radial position at which the optical disk medium is reproduced. Further, the transient absorbing circuit of the invention is characterized in that there is provided an initial voltage generating circuit for applying fixed voltages of opposite polarities to the capacitors during a state when an input bias voltage of a differential amplifying circuit provided for the AC amplifying circuit is set to a reference voltage. Correspondingly, the transient aborbing circuit discontinues upon non-reproduction the supply of the fixed voltage upon reproduction. When the optical disk medium is a magnetooptical recording medium which records data by altering the direction of magnetization, the initial voltage generating circuit generates a reproduction signal level, from a mirror surface portion in an ID area in which the track sector numbers have been recorded as convex and concave shapes. The initial voltage generating circuit therefore generates a value near an erasing level of the magnetooptical reproduction signal as a fixed voltage in a user area in which data can be magnetooptically recorded and reproduced. Further, the initial voltage generating circuit has a D/A converter for variably setting the value of the fixed voltage that is applied upon non-reproduction. The D/A converter sets the value of the fixed voltage that is applied upon non-reproduction in accordance with, for example, the kind of optical disk medium loaded in the apparatus.

According to such an optical disk apparatus of the invention, since an AC-like transient state which occurs in the reproduction signal that was PWM recorded can be automatically corrected by the transient absorbing circuit provided for the data reproducing unit, even in the case where the signal amplitude differs depending on the kind or recording conditions of the recording medium of a different reflectance such as rewritable type medium, full ROM, or the like, the stable slice level can be formed and the read data can be accurately demodulated from the reproduction signal that was PWM recorded. Thus, the PWM recording system which enables the recording density to be remarkably increased as compared with the conventional PPM recording can be put into practical use.

The above and other objects, features, and advantages of the present invention will become more apparent from the following detailed description with reference to the drawings.

BRIEF DESCRIPTION OF THE DRAWINGS

FIGS. 1A to 1E are explanatory diagrams of a PPM recording system;

FIGS. 2A to 2E are explanatory diagrams of a PWM recording system;

FIGS. 11A to 11D are operation timing charts for the transient absorbing circuit of FIG. 10;

DETAILED DESCRIPTION OF THE PREFERRED EMBODIMENTS

Figure 8:
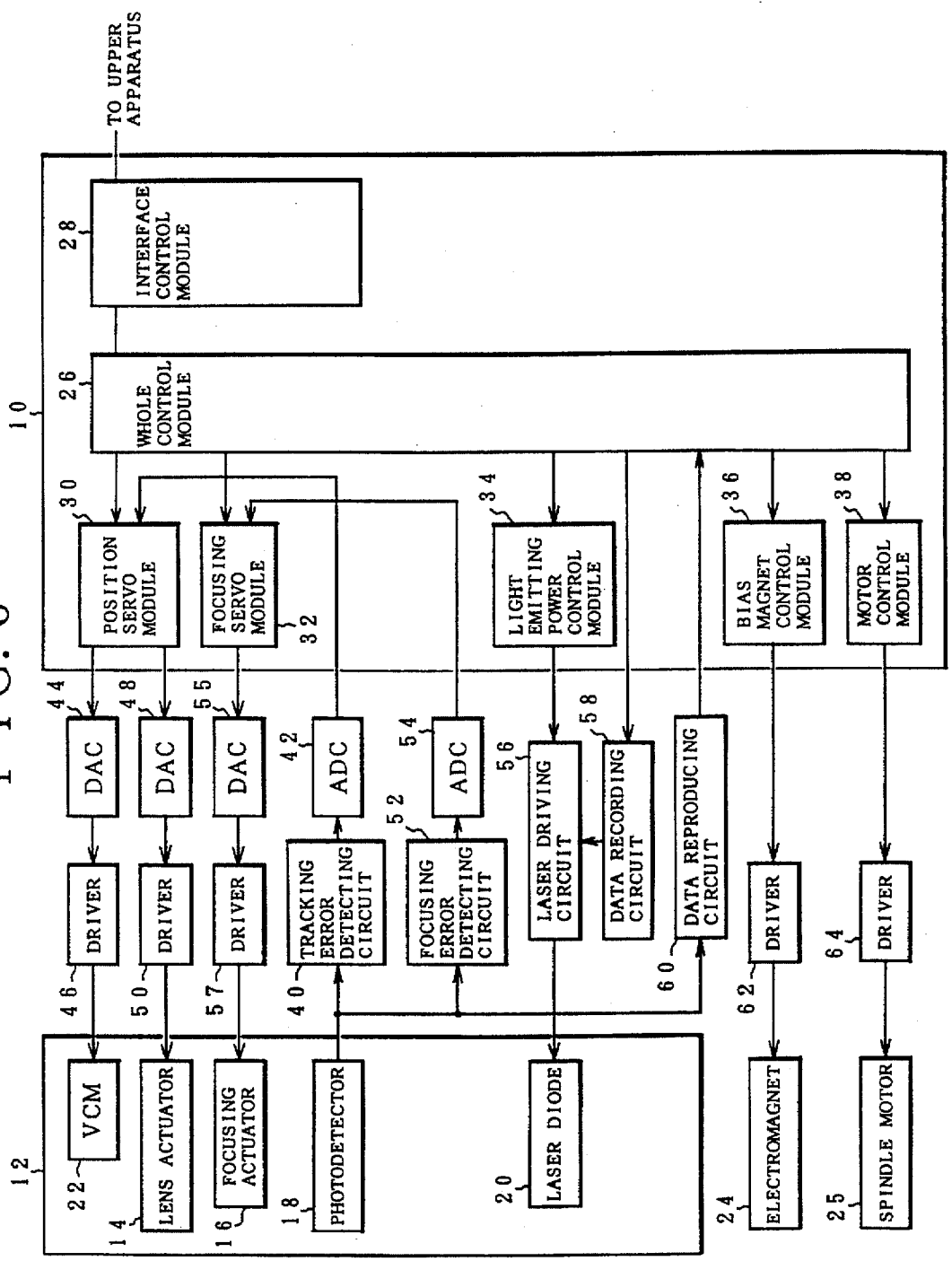
FIG. 8 is a whole block diagram of the invention.

In FIG. 8, an optical disk apparatus of the invention comprises a controller 10 and an optical head 12. The optical head 12 has a lens actuator 14, a focusing actuator 16, a photodetector 18, and a laser diode 20. The optical head 12 is divided into a fixed optical system and a movable optical system. The fixed optical system has the photodetector 18 and laser diode 20. On the other hand, the movable optical system has a two-dimensional actuator with an objective lens. The objective lens is moved in the radial direction of a disk medium by the lens actuator 14 and is moved in the optical axial direction by the focusing actuator 16. The head movable unit can be moved in the radial direction of the disk medium by a VCM 22. When a recording medium is a magnetooptical disk, an electromagnet 24 which is used at the time of the erasing and recording operations is provided on the optical head 12 side. A spindle motor 25 for rotating the disk medium is also provided. The controller 10 has a whole control module 26, an interface control module 28, a position servo module 30, a focusing servo module 32, a light emitting power control module 34, a bias magnet control module 36, and a motor control module 38. The whole control module 26 executes a whole control of the writing, reading, and erasing operations and the like on the basis of commands received from an upper optical disk control apparatus through the interface control module 28. For example, a SCSI interface is used as an interface control module 28. The position servo module 30 executes a positioning for the disk medium on the movable side of the optical head 12. For this purpose, a tracking error signal is detected by a tracking error detecting circuit 40 from a detection signal of the photodetector 18 provided for the optical head 12 and is supplied to an A/D converter 42, thereby detecting the head position. An output of the position servo module 30 drives the VCM 22 through a D/A converter 44 and a driver 46 and also drives the lens actuator 14 through a D/A converter 48 and a driver 50. In the ordinary reading/writing operations, by receiving a seek instruction from the whole control module 26, the position servo module 30 moves the optical head 12 to a track position as a target. In this instance, when the number of tracks to be jumped when the optical head 12 moves from the present track position to the target track position is equal to a predetermined number, for instance, 50 tracks or more, the optical head 12 is moved by the driving of the VCM 22. When the number of remaining tracks to the target track is, for example, less than or equal 50 tracks, the beam is positioned to the target track by driving the lens actuator 14, and after completion of the positioning, the VCM 22 is positioned to the target track. The focusing servo module 32 executes an automatic focusing control so as to focus a beam spot of a specified radius onto the disk medium surface by moving the objective lens in the optical axial direction by the focusing actuator 16 provided for the 2-dimensional actuator. For the automatic focusing control, a focusing error signal is detected by a focusing error detecting circuit 52 from a photosensitive signal of the photodetector 18 and is supplied to an A/D converter 54. The focusing actuator 16 is driven by a D/A converter 55 and a driver 57 so that a focusing error is always set to zero. The undo light emitting power control module 34 controls a light emission of the laser diode 20 by a laser driving circuit 56 so as to obtain a predetermined light emission power of the laser diode 20 in accordance with a write instruction, a read instruction, or an erase instruction from the whole control module 26. The bias magnet control module 36 drives the electromagnet 24 through a driver 62 at the time of the erasing operation, thereby executing the erasing operation of information on the medium. A data recording circuit 58 and a data reproducing circuit 60 are further provided for the controller 10. At the time of the writing operation, the data recording circuit 58 receives NRZ write data from the whole control module 26 and drives the laser driving circuit 56 to a write power by the light emitting power control module 34 on the basis of the write data, thereby writing information modulated by the light emission control of the laser diode 20 onto the optical disk medium. The data reproducing circuit 60 receives the reproduction signal by the photodetector 18 of the optical head 12, executes an amplification, a waveform equalization, and a binarizing process, reproduces read data and a read clock, and outputs them to the controller 10. A transient absorbing circuit is provided for the data reproducing circuit 60 in the invention.

Figure 9:
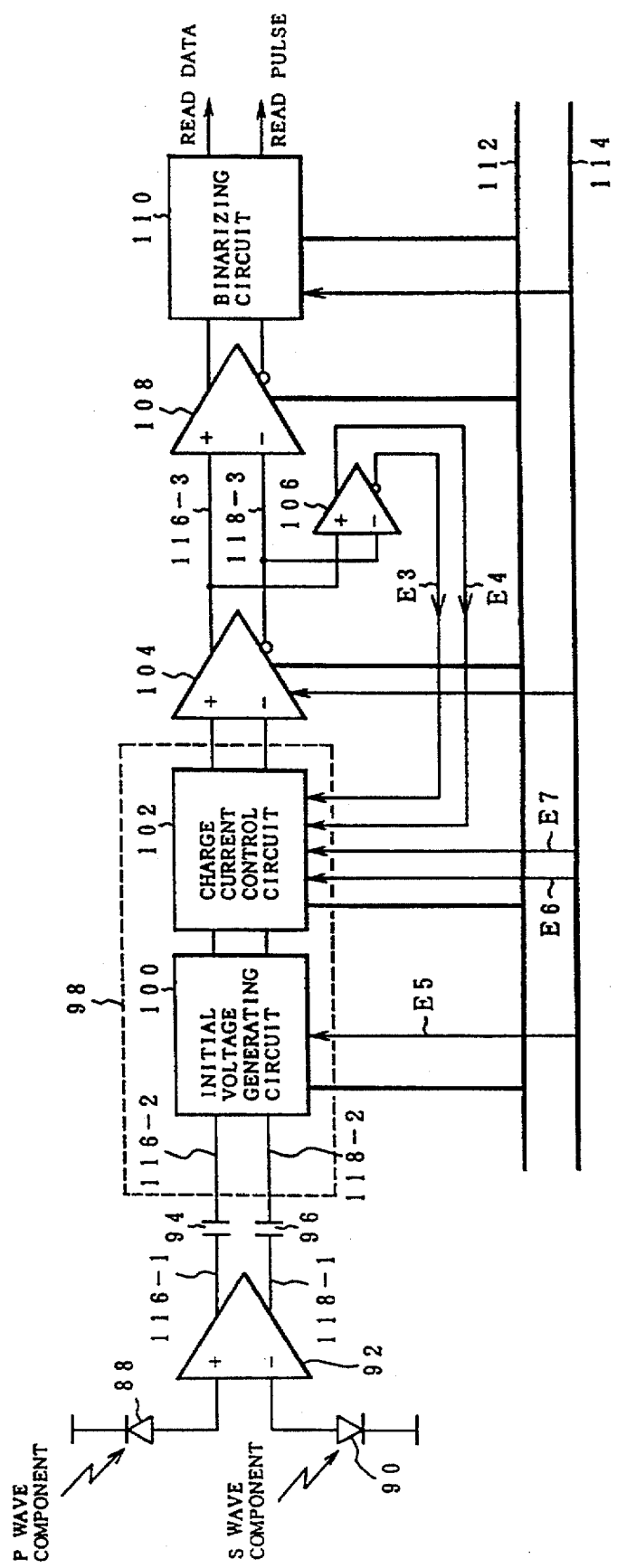
FIG. 9 is a block diagram of a data reproducing circuit in FIG. 8.

FIG. 9 shows an embodiment of the data reproducing circuit 60 in FIG. 8. In FIG. 9, the data reproducing circuit comprises a current/voltage converting circuit 92, a transient absorbing circuit 98, an AGC amplifying circuit 104, a waveform equalizing circuit 108, and a binarizing circuit 110. The current/voltage converting circuit 92 is constructed by a differential amplifier. Signals from the current/voltage converting circuit 92 to the binarizing circuit 110 are differential signals. Signal lines 116-1 and 118-1 from the current/voltage converting circuit 92 are inputted to the AGC amplifying circuit 104 by signal lines 116-2 and 118-2 through capacitors 94 and 96 for AC coupling and the transient absorbing circuit 98 newly provided by the present invention. The AGC amplifying circuit 104 executes an AGC amplifying operation so as to always obtain a specified signal level for a level fluctuation of the input reproduction signal. The waveform equalizing circuit 108 has a low-pass filter and an equalizing circuit. The low-pass filter eliminates unnecessary high frequency components included in the reproduction signal from the AGC amplifying circuit 104. As a low-pass filter for this purpose, a low-pass filter of the Bessel type or Equalripple type having excellent phase delaying characteristics is used. The equalizing circuit improves a waveform resolution. The binarizing circuit 110 sets a slice level for the reproduction signal outputted from the waveform equalizing circuit 108, converts the signal into a binarization signal by a slice circuit, further, forms data pulses at respective points of leading and trailing edges of the binarization signal, and outputs them as data pulses. The data pulses are inputted to a PLL, a clock is extracted from the data pulses and is outputted as a read clock, so that a clock and data are formed through a data separator. The binarization of the reproduction signal and the formation of the read data in the binarizing circuit 110 will be further described in more detail hereinbelow.

A waveform reproduced when the recording pits on the disk medium are scanned by the read beam as shown in FIGS. 2A and 2B is a waveform having peaks at positions where the recording pits exist as shown in FIG. 2C. A slice level is set for the reproduction waveform, thereby converting the waveform to a binary waveform of FIG. 2D. Detection pulses of FIG. 2E are formed in a manner such that the binary waveform is differentiated and, after that, a differentiation signal exceeding a predetermined level is detected, thereby forming a gate signal, a zero-cross detection signal of the differentiation signal is simultaneously formed, and the detection pulses are formed as pulse signals each having a predetermined time interval since the AND of the gate signal and the zero-cross detection signal is obtained. The detection pulses become read data. Referring again to FIG. 9, the read data and read clock from the binarizing circuit 110 are sent to a decoder (not shown). In the case where, for example, a conversion to the RLL 2–7 code was executed at the time of the recording, an inverse conversion to the RLL 2–7 code is executed, thereby forming NRZ data. The reproduction data is transferred to an upper optical disk control apparatus via an SCSI bus or the like.

Figure 3A:
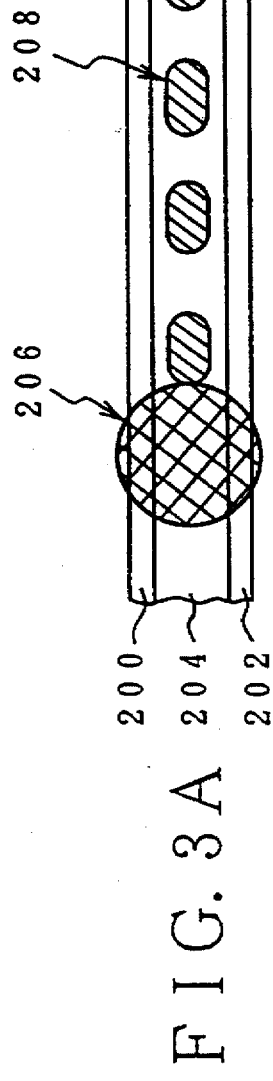
FIGS. 3A and 3B are explanatory diagrams of a pit recording state and a reproduction waveform of the PPM recording system.
Figure 3B:
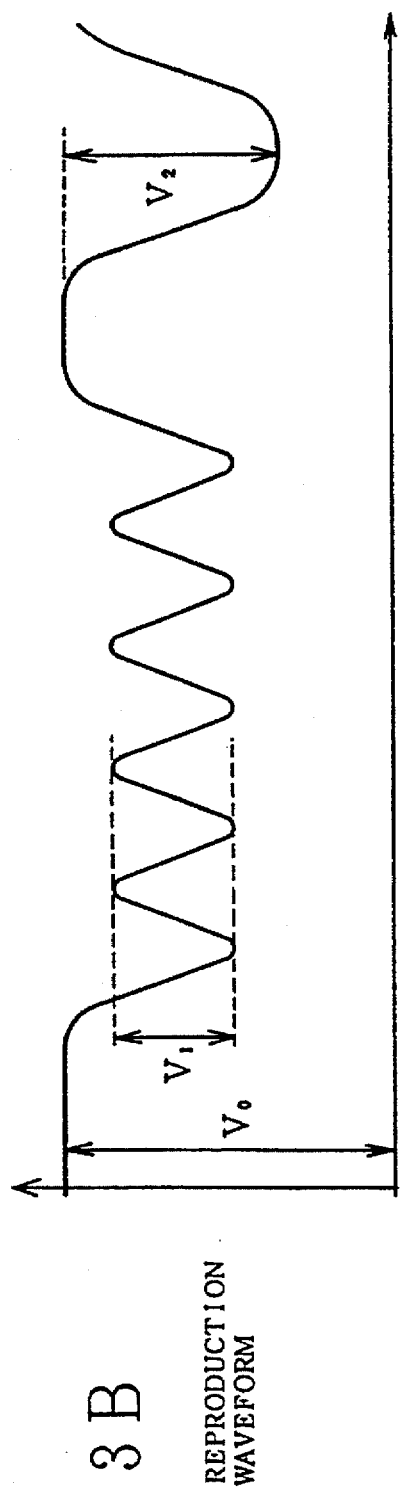
Figure 4:
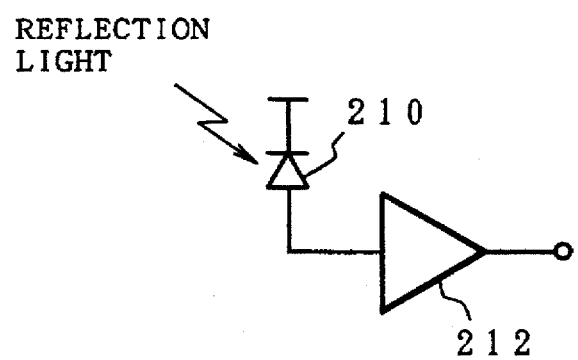
FIG. 4 is an explanatory diagram of the reception of a reflection light and a DC amplifying system.
Figure 5:
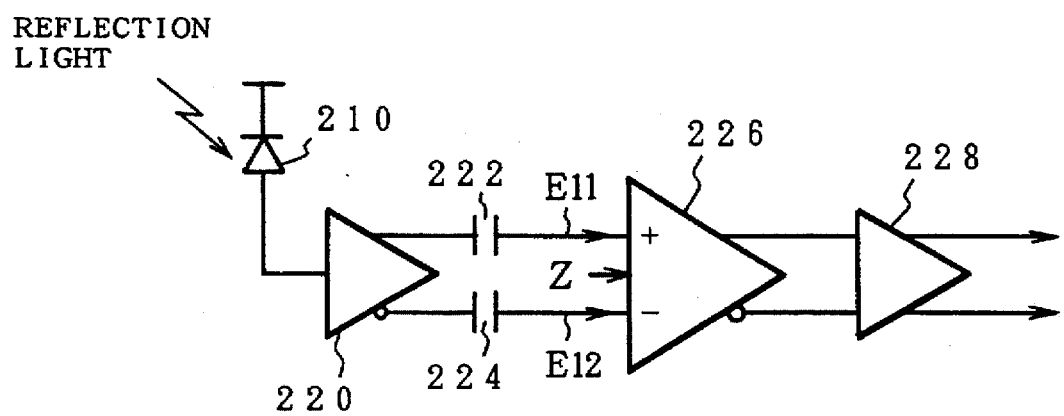
FIG. 5 is an explanatory diagram of the reception of the reflection light and an AC amplifying system.
Figure 6:
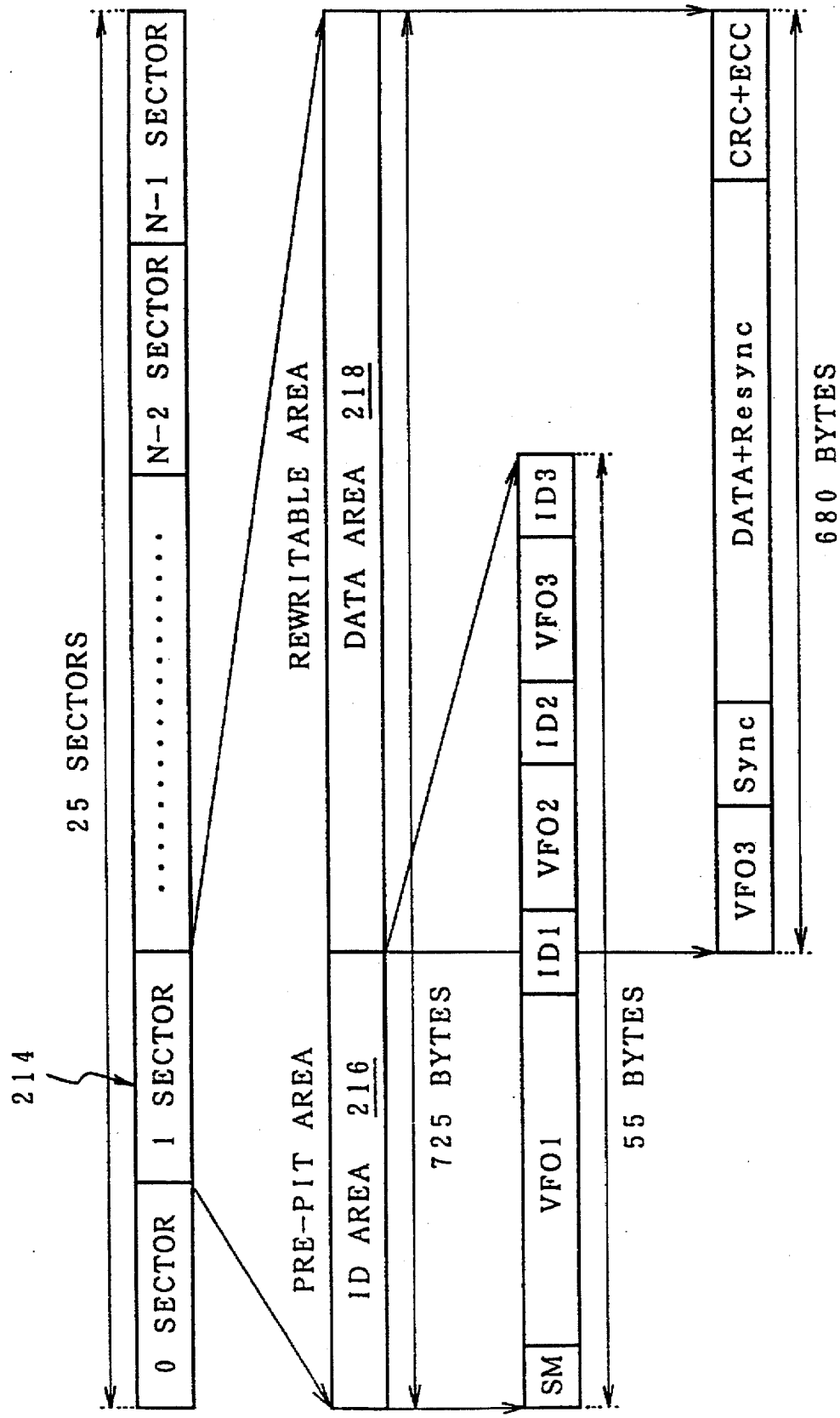
FIG. 6 is an explanatory diagram of a track format of an optical disk.

For such a data reproducing circuit 60 in FIG. 8, as shown in FIG. 9, in the invention, the transient absorbing circuit 98 is provided-between the capacitors 94 and 96 which perform the AC coupling to the current/voltage converting circuit 92 and the AGC amplifying circuit 104. The transient absorbing circuit 98 is constructed by an initial voltage generating circuit 100 at the front stage and a charge current control circuit 102 at the post stage. The initial voltage generating circuit 100 charges to an initial voltage of a polarity opposite to that of the transient state. That is, a direction of the occurrence of the transient state which occurs in the reproduction system is always set to a predetermined direction and an amount of the transient state can be almost presumed. Therefore, the initial voltage of the polarity opposite to that of the transient state is previously charged to each of the capacitors 94 and 96 by the initial voltage generating circuit 100 in a state in which the AGC amplifying circuit 104 is disconnected or is connected via a high resistance upon non-reproduction. At the moment when the operating mode is switched to the reproducing mode and the transient state occurs, the supply of the initial voltage to each of the capacitors 94 and 96 is disconnected and is simultaneously connected to the AGC amplifying circuit 104, thereby enabling the transient state to be reduced. For this purpose, a gate signal E5 is supplied from the outside to the initial voltage generating circuit 100 by a control line 114. The gate signal E5 is in a disable state upon non-reproduction and is in an enable state upon reproduction. When the gate signal E5 is in the disable state, therefore, the initial voltage generating circuit 100 disconnects the connection to the AGC amplifying circuit 104 and simultaneously charges the initial voltage of the polarity opposite to that of the presumed transient state to each of the capacitors 94 and 96. When the mode is switched to the reproducing mode and the gate signal E5 becomes enable, the supply of the initial voltage to each of the capacitors 94 and 96 is disconnected and is simultaneously connected to the AGC amplifying circuit 104. Further, a control data bus 112 is connected to the initial voltage generating circuit 100. The control data bus 112 can externally set the initial voltage which is charged to each of the capacitors 94 and 96. For this purpose, the initial voltage generating circuit 100 has a D/A converter therein and generates the initial voltage based on initial voltage set data given from the control data bus 112. For example, in addition to the rewritable magnetooptical disk, there is an optical disk on which the whole surface has already been recorded as concave and convex pits, namely, what is called a full ROM optical disk medium. Since a reflectance of the full ROM is a few times as large as that of the magnetooptical disk, the transient state is also larger by an amount corresponding to the larger reflectance. Whether the optical disk is the full ROM or not is discriminated by a control track specified by the ISO. By supplying the initial voltage set data for transient absorption to the control data bus 112 in accordance with the kind of disk at the stage when the kind of disk can be discriminated by loading the optical disk, an optimum initial voltage can be generated to any medium. The charge current control circuit 102 provided subsequent to the initial voltage generating circuit 100 controls charge currents to the capacitors 94 and 96 so as to dynamically absorb the transient state which occurs during the reproduction. A feedback control of the charge current control circuit 102 is executed in a manner such that the reproduction signal output from the AGC amplifying circuit 104 is input to a comparator 106 from signal lines 116-3 and 118-3 and the charge currents to the capacitors 94 and 96 are controlled on the basis of comparison outputs of the comparator 106. That is, in a state where no transient state occurs, differential signals of the signal lines 116-3 and 118-3 have amplification changes in which phases are different by 180' while using the AC ground as a center. The comparator 106 generates the comparison outputs in which duties are equal to 50% per one cycle of the reproduction signal. Using the comparison outputs of the duties from the comparator 106, the charge current control circuit 102 controls so that the voltages of the capacitors 94 and 96 are equal to the level of the AC ground of the signal lines 116-2 and 118-2. On the other hand, when the transient state occurs, the reproduction signal on the signal line 116-2 side is offset to the (+) side in accordance with the transient state and the reproduction signal on the signal line 118-2 side is simultaneously offset to the (−) side in accordance with the transient state. Similarily, the signal lines 116-3 and 118-3 for the outputs of the AGC amplifying circuit 104 are also offset. Thus, duty ratios of the comparison outputs of the comparator 106 differ. A period of time of the charge current to each of the capacitors 94 and 96 is changed in accordance with the change in duty ratio according to the transient state. The charges of a polarity opposite to that of the transient state are injected to each of the capacitors 94 and 96, thereby dynamically absorbing the transient state. The comparison outputs by the comparator 106 to the charge current control circuit 102 are control signals E3 and E4. The control signal E4 is a signal obtained by inverting the polarity of the control signal E3. Further, current set data for determining the magnitude of the charge current is given to the charge current control circuit 102 by the control data bus 112. A supply current by a current source can be varied by the built-in D/A converter. An enable signal E6 and a gain-up signal E7 are given by the control line 114. The enable signal E6 sets a period of time in which the charge current control circuit 102 operates. Specifically, in a track format of FIG. 6, the enable signal E6 is supplied to drive the charge current control circuit 102 in each of VFO1 in the ID area 216 and VFO3 in the data area 218. The gain-up signal E7 is used to improve a response speed by increasing the charge current to each of the capacitors 94 and 96 at a timing of the initial stage for the period of time of a transient absorbing operation by the enable signal E6 and rapidly charging the capacitors by the opposite polarity for the transient state. Particularly, since fine patterns of the highest frequency are recorded in VFO1 in the ID area 216 and VFO3 in the data area 218 in the track format of FIG. 6, the charge current is increased by the gain-up signal E7 in order to improve absorbing characteristics of the transient state which occurs upon reproduction of the recording patterns, thereby improving a tracing performance.

Figure 7:
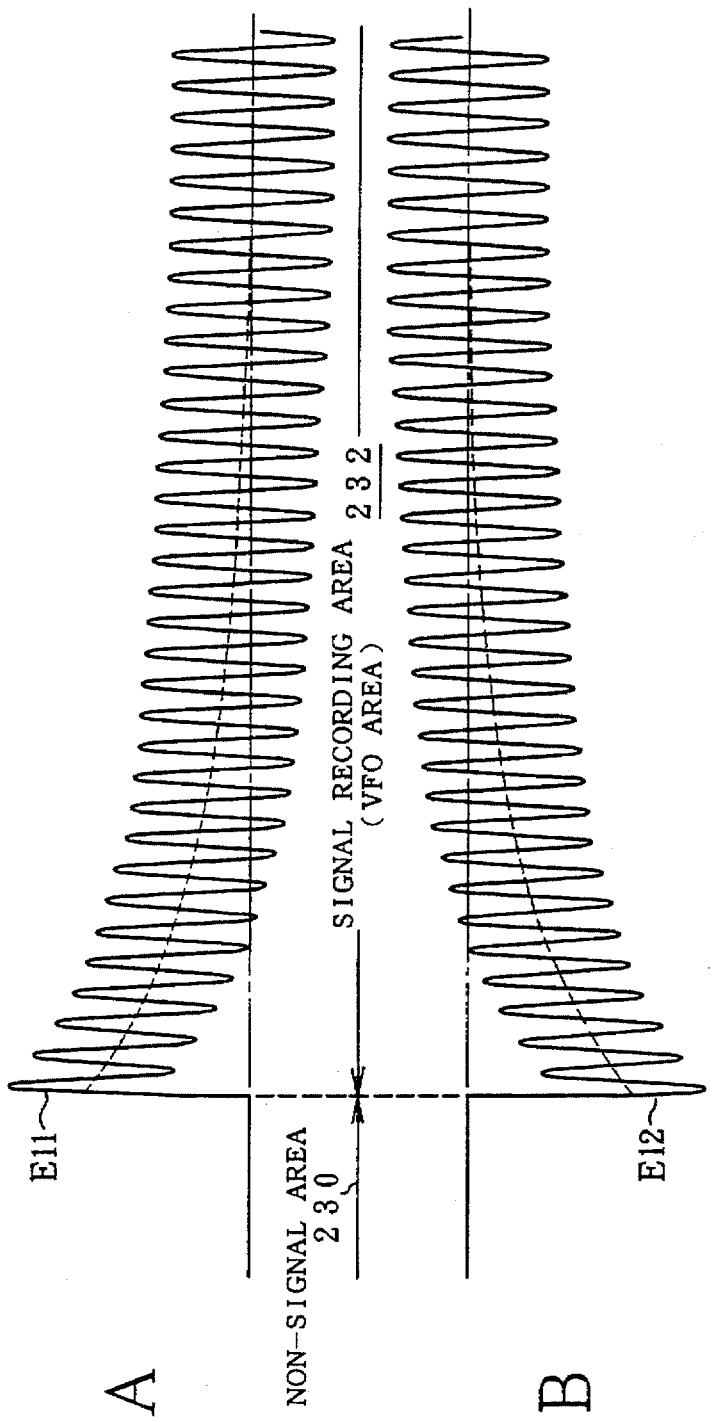
FIGS. 7A and 7B are diagrams showing waveforms of a transient state which occurs by an AC coupling in FIG. 5.
Figure 10:
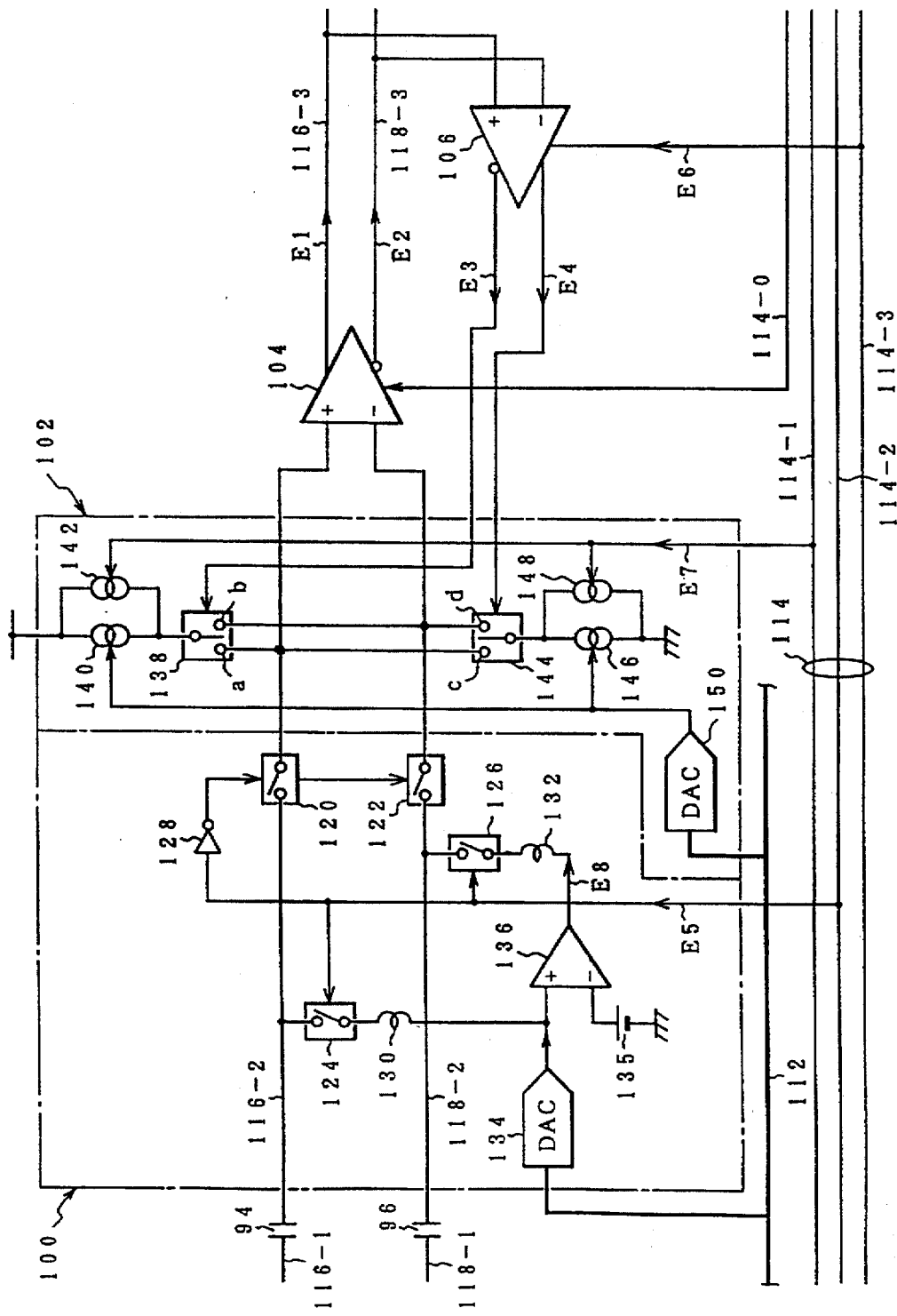
FIG. 10 is a circuit diagram showing an embodiment of a transient absorbing circuit in FIG. 8.

FIG. 10 shows a circuit construction of the transient absorbing circuit 98 in FIG. 9. In FIG. 10, analog switches 120 and 122 for disconnecting the signal lines 116-2 and 118-2 from the AGC amplifying circuit 104 are inserted and connected to the initial voltage generating circuit 100. The analog switches 120 and 122 are driven by a signal obtained by inverting the gate signal E5 from a gate signal line 114-2 in the control line 114 by an inverter 128. That is, as shown in FIGS. 11A to 11D, the gate signal E5 is at the (H) level in the disable state upon nonreproduction and is set to the (L) level by the inversion by the inverter 128. The analog switches 120 and 122 are consequently turned off as shown in the diagram, thereby disconnecting the AGC amplifying circuit 104 from a differential amplifying unit having transistors 152 and 154. At the time of the reproduction, the gate signal E5 is asserted and is set to the (L) level and is inverted to the (H) level by the inverter 128. The analog switches 120 and 122 are consequently turned on, thereby connecting the signal lines 116-2 and 118-2 to the AGC amplifying circuit 104. A D/A converter 134 is also provided for the initial voltage generating circuit 100 and the control data bus 112 is connected to the D/A converter 134. The D/A converter 134 outputs the initial voltage E7 corresponding to the initial voltage set data set by the control data bus 112. The initial voltage E7 from the D/A converter 134 is connected to the signal line 116-2 side, to which the capacitor 94 is connected, through an inductance 130 for cutting out the AC components and an analog switch 124. The initial voltage E7 of the D/A converter 134 is also inverted by an operational amplifier 136 in which the AC ground is set as a reference voltage by a constant voltage source 135 and becomes an inversion initial voltage E8. The inversion initial voltage E8 is connected to the signal line 118 side, to which the capacitor 96 is connected, through an inductance 132 for cutting out the AC components and an analog switch 126. In this instance, the inversion initial voltage E8 outputted by the operational amplifier 136 is equal to (E8=−E7). The analog switches 124 and 126 are on/off controlled by the read detection signal E5 from the gate signal line 114-2 provided for the control line 114. That is, as shown in FIG. 11B, since the gate signal E5 is set to the (H) level upon non-reproduction, the analog switches 124 and 126 are turned on, the capacitor 94 is charged to the initial voltage E7 by the D/A converter 134 as shown in FIG. 11C, and the capacitor 96 is simultaneously charged to the inversion initial voltage E8 from the operational amplifier 136. The operation of the initial voltage generating circuit 100 is as follows. The analog switches 120 and 122 are turned off, at the time of non-reproduction by the inverted gate signal E5, disconnecting the signal lines 116-2 and 118-2 from the AGC amplifying circuit 104. The analog switches 124 and 126 are simultaneously turned on. In this instance, the initial voltage set data corresponding to the disk medium which is presently loaded in the apparatus, for instance, the magnetooptical disk medium is supplied to the D/A converter 134 by the control data bus 112. On the basis of the initial voltage set data, the initial voltage E7 is charged to the capacitor 94 through the analog switch 124 and the inversion initial voltage signal E8 obtained by the inversion by the operational amplifier 136 is simultaneously applied to the capacitor 96 through the analog switch 126. In such a state, when the scanning of the read beam to the magnetooptical disk medium enters from a non-reproduction area to a reproduction area, namely, a sector head area of the track format shown in FIG. 6, by first reproducing VF01 in which the recording pits have been recorded at the highest frequency by the PWM recording system, transient states as shown in FIGS. 7A and 7B occur. Since the gate signal E5 is asserted in this instance, the analog switches 124 and 126 are turned off, thereby disconnecting the supply of the initial voltages E7 and E8. The analog switches 120 and 122 are simultaneously turned on, thereby connecting the voltages to the AGC amplifying circuit 104. When the input reproduction signal having the transient state passes through the capacitors 94 and 96, the transient components are eliminated by the initial voltage of the opposite polarity, so that the occurrence of the transient state is suppressed.

The charge current control circuit 102 in FIG. 10 will now be described. The charge current control circuit 102 has analog change-over switches 138 and 144. A source current source 140 for emitting (flowing) currents into the capacitors 94 and 96 is connected to the analog change-over switch 138. On the other hand, a sync current source 146 for sucking (discharging) the currents from the capacitors 94 and 96 is connected to the analog switch 144. The source current source 140 and sync current source 146 can set current values by a D/A converter 150. A source current source 142 for increasing a gain is connected in parallel with the source current source 140. A sync current source 148 for increasing a gain is also connected to the sync current source 146. The source current source 142 and sync current source 148 for acceleration are on/off controlled by the gain-up signal E7 from a gain-up signal line 114-1 of the control line 114. As shown in FIGS. 11A and 11D, for instance, the gain-up signal E7 is set to the (H) level and is turned on for a first predetermined period of time of VFO1 in the ID area when the charge current control circuit 102 enters the enable state and for a first predetermined period of time of VFO3 in the data area, thereby supplying a current added with a predetermined constant current to each of the source current source 140 and sync current source 146. The analog change-over switches 138 and 144 are changed over by the control signals E3 and E4 from the comparator 106. A switching terminal (a) of the analog change-over switch 138 is connected to the signal line 116-2 on the capacitor 94 side. A switching terminal (b) is connected to the signal line 118-2 on the capacitor 96 side. A switching terminal (c) of the analog switch 144 is connected to the signal line 116-1 side of the capacitor 94 and a switching terminal (d) is connected to the signal line 118-1 side of the capacitor 96. By the control signals E3 and E4 from the comparator 106, the analog switches 138 and 144 are interlockingly switched as follows.

I. When the analog switch 138 is closed to the switching terminal (a), the analog switch 144 is closed to the switching terminal (d).

II. When the analog switch 138 is closed to the switching terminal (b), the analog switch 144 is closed to the switching terminal (c).

That is, when the analog switch 138 is switched to the switching terminal (a) side and the current is supplied from the source current source 140 to the capacitor 94, the analog switch 144 is simultaneously switched to the switching terminal (d) side and the same current is absorbed from the capacitor 96 by the sync current source 146. When the analog switch 138 is switched to the switching terminal (b) side, the current is discharged from the source current source 140 to the capacitor 96. Simultaneously, the analog switch 144 is switched to the switching terminal (c) side and the same current is absorbed from the capacitor 94 to the sync current source 146. The comparator 106 is made operative by the enable signal E6 from an enable signal line 114-3 of the control line 114. The enable signal E6 is set to the (H) level for the periods of time of VF01 in the ID area and VF03 in the data area on the disk medium as shown in FIGS. 11A and 11C. Since the control signals E3 and E4 are valid in this instance, the charge current control circuit 102 executes the transient absorbing operation. The AGC amplifying circuit 104 is gain controlled by an AGC control line 114-0.

The operation of the charge current control circuit 102 in FIG. 10 will now be described. In the non-reproducing mode, the analog switches 120 and 122 provided for the initial voltage generating circuit 100 are off. The enable signal E6 is also set to the (L) level and the control signals E3 and E4 from the comparator 106 cannot be obtained, so that the analog switches 138 and 144 are in a disconnected state as shown in the diagram. When the read beam enters the reproduction area on the disk medium, the analog switches 120 and 122 are turned on in association with the operation of the initial voltage generating circuit 100 and simultaneously the enable signal E6 is set to the (H) level, so that the comparator 106 is made operative.

Figure 12A:
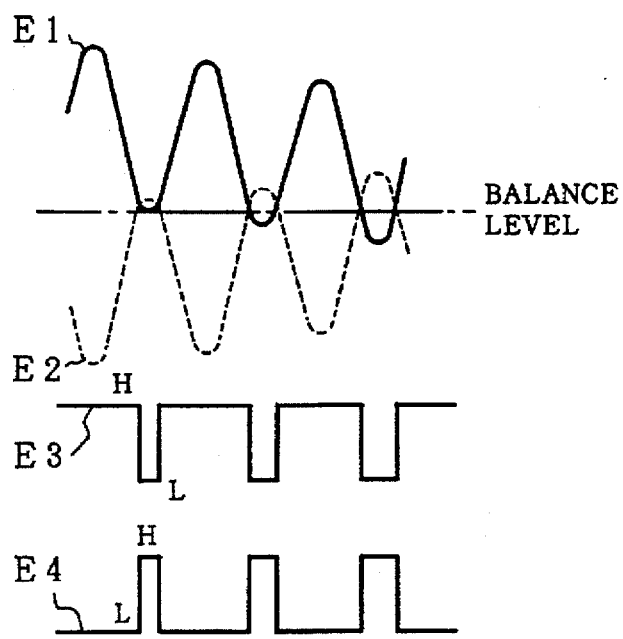
FIGS. 12A to 12C are explanatory diagrams showing a feedback operation at the time of the occurrence of a transient state based on a comparison output of a comparator in FIG. 10.
Figure 12B:
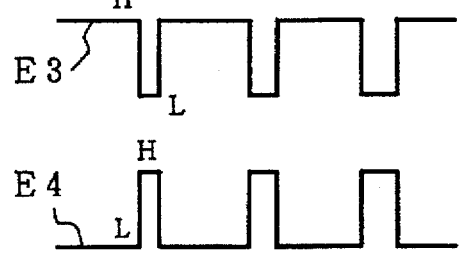
Figure 12C:

FIG. 12A shows reproduction signals E1 and E2 of the signal lines 116-3 and 118-3 of outputs of the AGC amplifying circuit 104 when the transient state occurs. The reproduction signal E1 which is offset to the (+) side by only an amount of the transient state for the AC ground and the reproduction signal E2 which is contrarily offset to the (−) side are inputted to the comparator 106. As shown in FIG. 12B, therefore, the control signal E3 from the comparator 106 is set to the (H) level for a period of time during which the reproduction signal E1 is above the reproduction signal E2 and is set to the (L) level when the reproduction signal E1 is below the reproduction signal E2. On the contrary, as shown in FIG. 12C, the control signal E4 becomes a signal obtained by inverting the control signal E3. When the control signal E3 is at the (H) level, the analog change-over switch 138 is switched to the switching terminal (a) side and the current from the sync current source 140 is discharged to the capacitor 94. Simultaneously, the analog switch 144 is switched to the (d) side by the control signal E4, the capacitor 96 is connected to the sync current source 146 to thereby absorb the current in a manner similar to the case of the source current source 140. The current discharge and current absorption to/from the capacitors 94 and 96 are executed for the (H) level period of time of the control signal E3 and the (L) level period of time of the control signal E4. Since those periods are the times corresponding to the offset amounts of the reproduction signals E1 and E2 for the AC ground, a voltage opposite to the offset occurring in the transient state is charged to each of the capacitors 94 and 96, thereby absorbing the transient state. When the control signal E3 is subsequently set to the (L) level, the analog change-over switch 138 is switched to the (b) side, the current is discharged from the source current source 140 to the capacitor 96, and the voltage of the capacitor 96 is decreased by applying the charges in the direction opposite to that of the previous charge. The analog change-over switch 144 is simultaneously switched to the switching terminal (c) side, the sync current source 146 is connected to the capacitor 94, and the transient absorption voltage of the capacitor is reduced by executing the current absorption in the direction opposite to that of the previous time. Thus, the voltages of the opposite polarities of the capacitors 94 and 96 are reduced by only an amount corresponding to the reduction amount of the transient state. In a manner similar to the above, the analog change-over switches 138 and 144 are turned on or off by the duty signals according to the offsets by the transient states of the reproduction signals E1 and E2.

Figure 13A:
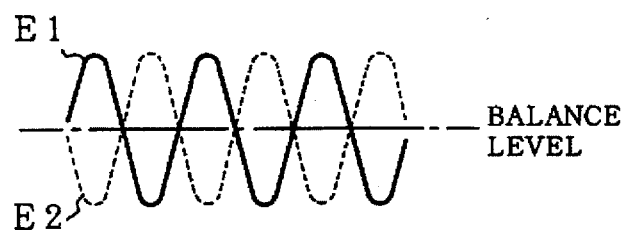
FIGS. 13A to 13C are explanatory diagrams showing a feedback operation at the time of the settlement of the transient state based on the comparison output of the comparator in FIG. 10.
Figure 13B:
Figure 13C:

FIG. 13A shows a state in which the reproduction signals E1 and E2 are settled by the absorption of the transient state. Since the reproduction signals E1 and E2 have the same amplitude in the vertical direction around the AC ground as a center and their polarities are inverted each other, a duty of the control signal E3 from the comparator 106 is equal to 50% as shown in FIG. 13B and the control signal E4 is also the signal obtained by inverting the control signal E3 as shown in FIG. 13C. Consequently, the current discharge and absorption to/from the capacitors 94 and 96 are alternately executed at the same period by the control signals E3 and E4 and the voltages of the capacitors 94 and 96 can be maintained to the voltage of the AC ground. Further, as shown in FIGS. 11A and 11D, for instance, the gain-up signal E7 is set to the (H) level for a start interval of the first VF01 in the ID area. Therefore, both of the source current source 142 for gain-up and the sync current source 148 are turned on and the discharge of the source currents to which the currents by the current sources 142 and 148 are added to the current sources 140 and 146 for supplying the currents decided by the D/A converter 150 and the absorption of the sync currents are executed to/from the capacitors 94 and 96. Thus, the transient state occurring at the time of the start of VF01 can be absorbed at a high speed and can be settled in a short time. When the current values by the source current source 140 and sync current source 146 are set by the D/A converter 150 provided for the charge current control circuit 100, in a manner similar to the case of the initial voltage generating circuit 100, proper current values are set in accordance with the kind of optical disk medium, namely, whether the optical disk medium is the rewritable optical disk medium or an optical disk medium which cannot be rewritten. As a rewritable optical disk medium, for example, there are a magnetooptical disk and an optical disk of a phase change type. As an unrewritable optical disk medium, there is a full ROM optical disk (CD-ROM optical disk). Further, with respect to a P-ROM optical disk which can be partially rewritten, proper current values are divisionally set to a rewritable portion and an unrewritable portion. The current value by the D/A converter 150 can be also increased or decreased in accordance with the position of the reproduction disk radius of the optical disk medium. That is, when the pits are recorded at a constant recording frequency for the disk radius, a change in transient state increases with an increase in disk radius. By increasing the current value that is set by the D/A converter 150 in accordance with an increase in disk radius, a proper transient absorption according to the disk radius can be executed.

Figure 14:
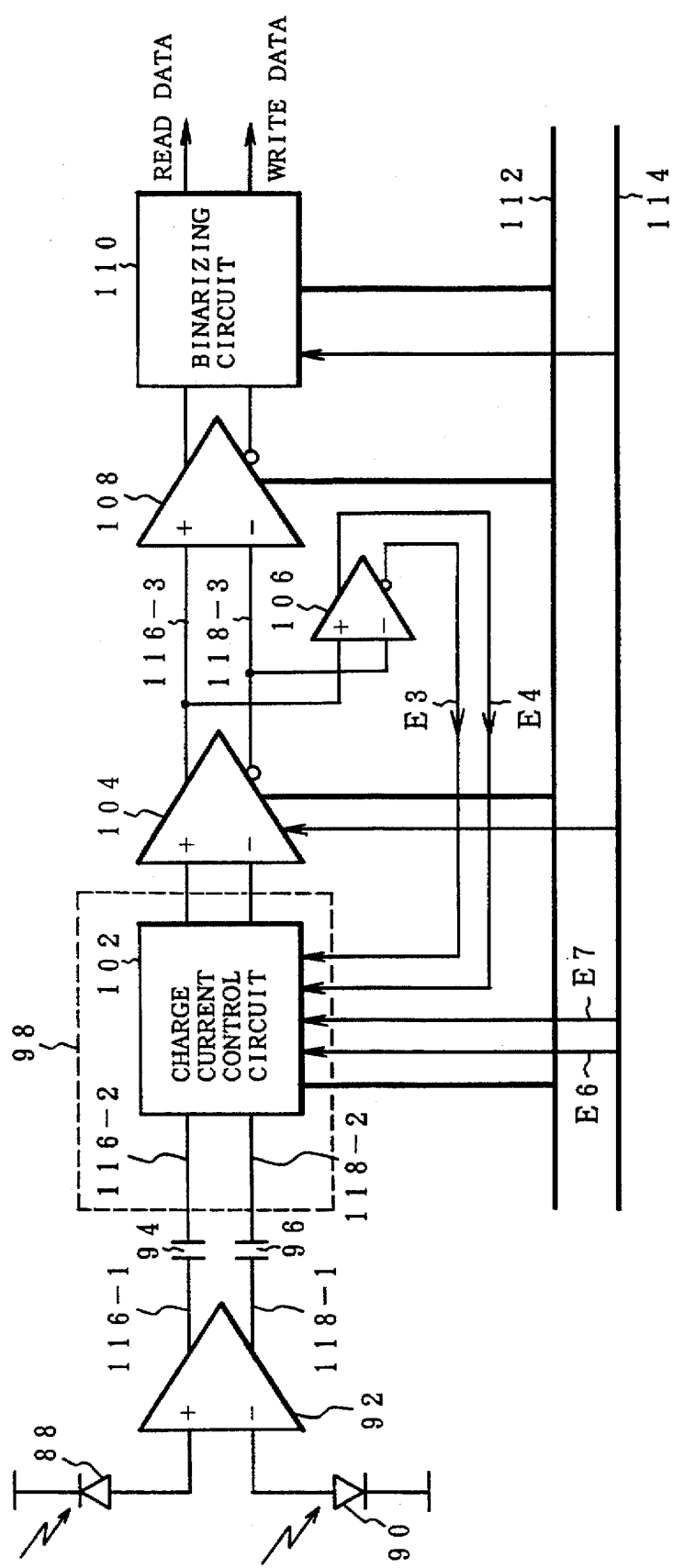
FIG. 14 is a block diagram showing another embodiment of the data reproducing circuit of the invention.
Figure 15:
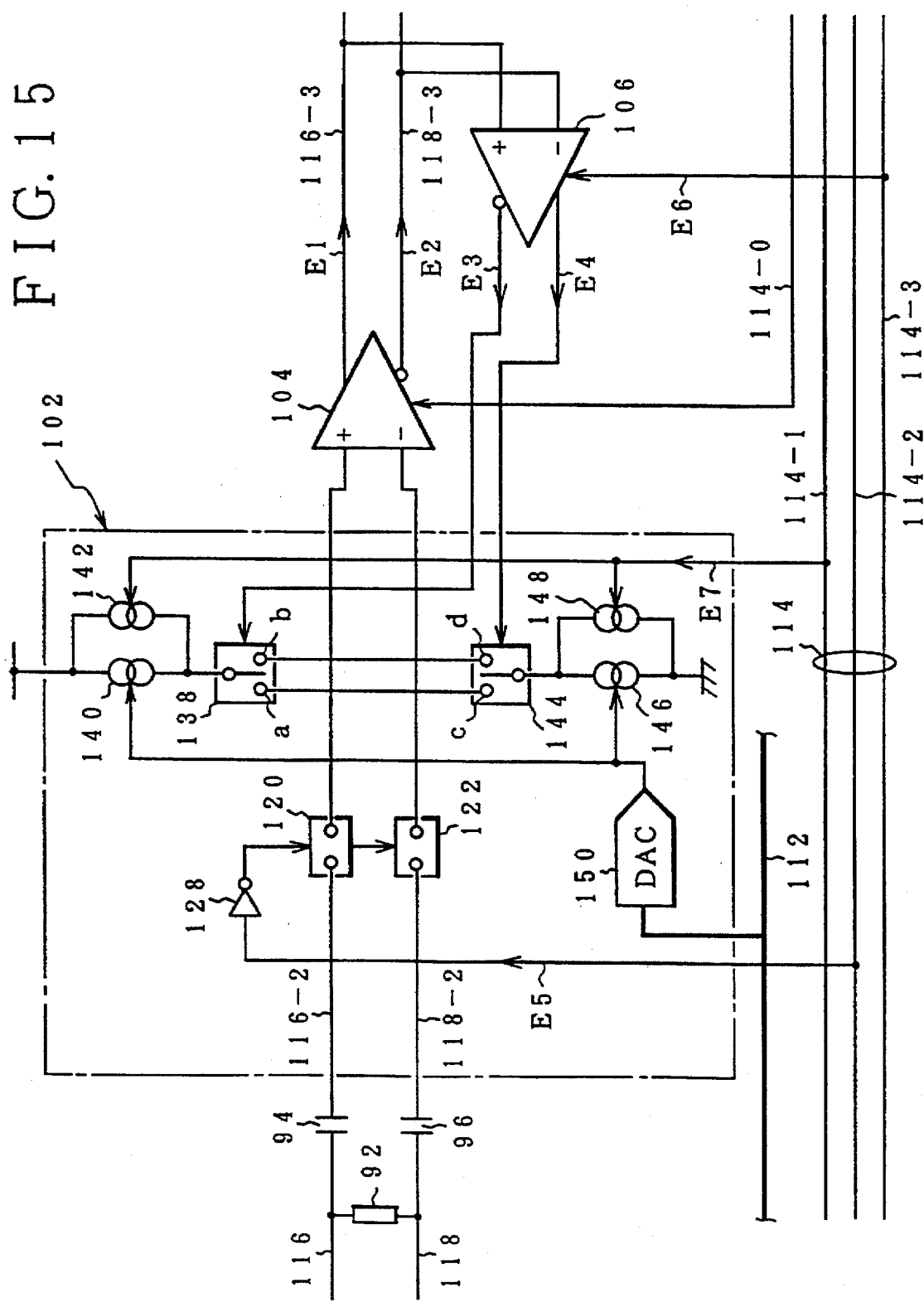
FIG. 15 is a circuit diagram of an embodiment of a transient absorbing circuit in FIG. 14.

FIG. 14 shows another embodiment of a data reproducing circuit in the optical disk apparatus of the invention and is characterized in that the initial voltage generating circuit is not provided for the transient absorbing circuit 98 but only the charge current control circuit 102 is provided. FIG. 15 is a circuit diagram of an embodiment of the transient absorbing circuit 98 in FIG. 14. When the embodiment is compared with the embodiment of FIG. 10, the initial voltage generating circuit 100 is eliminated and the analog switches 120 and 122 which are turned on or off by the inversion signal of the gate signal E5 by the inverter 128 are newly provided for the charge current control circuit 102. The construction other than those components is substantially the same as that of the embodiment of FIG. 11. Even such a transient absorbing circuit 98 constructed by only the charge current control circuit 102 having no initial voltage generating circuit 100 can execute the transient absorption which can be sufficiently practically used although the settling time by the transient absorption is a little longer than that in the case where the initial voltage generating circuit is provided.

According to the invention as mentioned above, since the AC-like transient state which occurs in the reproduction signal from the optical disk medium by the PWM recording system can be automatically absorbed and corrected, even when the transient state or amplitude of the reproduction signal differs depending on the recording conditions because the reflectances of the rewritable magnetooptical disk medium and the full ROM in which data has fixedly been recorded are different, the reproduction signal that is stable in an AC manner is rapidly formed just after the reproduction and the slice level in the binarizing process of the reproduction signal can be properly set, so that an error rate can be guaranteed by the stable reproducing operation. Therefore, the invention can largely contribute to the realization of the practical use of the optical disk apparatus of the PWM recording system which can remarkably increase the recording density as compared with the conventional PPM recording system. The invention is not limited to the numerical values shown in the above embodiments.

What is claimed is:

1. A data reproducing apparatus for reading out data recorded on a medium by a pit width modulation method and reproducing the data, comprising:

a current/voltage converting circuit for converting a reproduction current reproduced from said medium to a voltage signal and for outputting said voltage signal as differential signals;

an AC amplifying circuit for AC coupling said differential signals from said current/voltage converting circuit through a pair of capacitors, amplifying an input reproduction voltage, and outputting said amplified reproduction voltage as differential signals; and a transient absorbing circuit for comparing the reproduction voltages of said differential signals outputted from said AC amplifying circuit and for controlling charge and discharge of each of said capacitors on the basis of said comparison outputs so that amplitude center levels of both of the reproduction voltages coincide with an AC ground of said differential signals outputted from said AC amplifying circuit.

2. An apparatus according to claim 1, wherein said transient absorbing circuit comprises:

a comparator for comparing the reproduction voltages of said differential signals outputted from said AC amplifying circuit and outputting comparison signals of duties according to a signal crossing state for said AC ground;

a source current source for supplying a current to each of the capacitors of said differential signals;

a sync current source for absorbing the current from each of the capacitors of said differential signal;

a first current switch for connecting said source current source to one of said capacitors in signal level state of one of the comparison signals outputted from said comparator and for connecting said source current source to the other capacitor in a signal level sate of the other comparison signal; and a second current switch for connecting said sync current source to one of said capacitors in a signal level state of one of inversion comparison signals outputted from said comparators and for connecting said sync current source to the other capacitor in a capacitor in a signal level sate of the other inversion comparison signal.

3. An apparatus according to claim 2, wherein in said transient absorbing circuit, current values of said source current source and said sync current source can be varied by a D/A converter.

4. An apparatus according to claim 2, wherein said transient absorbing circuit is constructed in a manner such that two current sources are provided as each of said source current source and said sync current source and said two current sources are connected in parallel and one of said current sources is proportional to a current value instructed by said D/A converter, and said two current sources can be selectively made operative by an external signal different from a signal for controlling the whole apparatus.

5. An apparatus according to claim 2, wherein said transient absorbing circuit further has an initial voltage generating circuit for applying fixed voltages of opposite polarities to said capacitors when an input bias voltage of a differential amplifying circuit provided for said AC amplifying circuit is set to a reference upon non-reproduction and for disconnecting the supply of said fixed voltages upon reproduction.

6. An apparatus according to claim 5, wherein said initial voltage generating circuit has a D/A converter for variably setting a value of said fixed voltage that is applied upon non-reproduction.

7. An apparatus according to claim 1, wherein in said transient abosrbing circuit, an operation state is controlled by a gate signal which is valid upon reproduction.

8. An optical disk apparatus comprising:

a data recording circuit for recording data onto an optical disk medium by a pit width modulation; and a data reproducing circuit for reading out the data recorded on said optical disk medium by the pit width modulation and reproducing the data;

wherein said data reproducing circuit has a current/voltage converting circuit for converting a reproduction current reproduced from said optical disk medium to a voltage signal and for outputting said reproduction current as differential signals;

an AC amplifying circuit for AC coupling said differential signals form said current/voltage converting circuit through capacitors, amplifying an input reproduction voltage, and outputting said amplified reproduction voltage as differential signals; and a transient absorbing circuit for comparing the reproduction voltages of said differential signals outputted from said AC amplifying circuit and for controlling charge and discharge of each of said capacitors on the basis of said comparison outputs so that amplitude center levels of both of the reproduction voltages coincide with an AC ground of said differential signals.

9. An apparatus according to claim 8, wherein said transient absorbing circuit comprises:

a comparator for comparing the reproduction voltages of said differential signals outputted from said AC amplifying circuit and outputting comparison signals of duties according to a signal crossing state for said AC ground;

a source current source for supplying a current to each of the capacitors of said differential signals;

a sync current source for absorbing the current form each of the capacitors of said differential signals;

a first current switch for connecting said source current source to one of said capacitors in a signal level state of one of the comparison signals outputted from said comparator and for connecting said source current source to the capacitor in a signal level state of the other comparison signal; and a second current switch for connecting said sync current source to one of said capacitors in a signal level state of one of inversion comparison signals outputted from said comparators and for connecting said sync current source to the other capacitor in a signal level state of the other inversion comparison signal.

10. An apparatus according to claim 9, wherein in said transient absorbing circuit, current values of said source current source and said sync current source can be varied by a D/A converter.

11. An apparatus according to claim 10, wherein said D/A converter increases or decreases the current values of the current sources in accordance with an increase or decrease of a radius position at which said disk medium is reproduced.

12. An apparatus according to claim 9, wherein said transient absorbing circuit operates in a VFO area which is located at the head portion of a sector format of said optical disk medium and in which data has been recorded at a single frequency.

* * * * *

UNITED STATES PATENT AND TRADEMARK OFFICE
CERTIFICATE OF CORRECTION

PATENT NO. : 5,699,343
DATED : December 16, 1997
INVENTOR(S) : Moritsugu et al.

It is certified that error appears in the above-identified patent and that said Letters Patent is hereby corrected as shown below:

Column 2, line 4, delete "in,".

Column 5, line 22, after "Operation" insert --of--.

Column 5, line 36, delete "source and sync current source decreases".

Column 5, line 43, before "state" insert --transient--.

Column 5, line 51, after "level" delete ",".

Column 8, line 65, between "provided" and "between" delete "-".

UNITED STATES PATENT AND TRADEMARK OFFICE
CERTIFICATE OF CORRECTION

PATENT NO. : 5,699,343
DATED : December 16, 1997
INVENTOR(S) : Moritsugu et al.

It is certified that error appears in the above-identified patent and that said Letters Patent is hereby corrected as shown below:

Column 11, line 15, delete "ES" and insert --

E8-- therefor.

Column 11, line 49, delete "ES" and insert --

E8-- therefor.

Signed and Sealed this

First Day of September, 1998

Attest:

BRUCE LEHMAN

Attesting Officer

Commissioner of Patents and Trademarks